United States Patent
Kwon et al.

(10) Patent No.: US 8,294,472 B2
(45) Date of Patent: Oct. 23, 2012

(54) RELIABILITY EVALUATION CIRCUIT AND RELIABILITY EVALUATION SYSTEM

(75) Inventors: Sang-jin Kwon, Yongin-si (KR); Jae-hoon Lee, Guri-si (KR); Yong-ha Kang, Yongin-si (KR); Jong-won Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 413 days.

(21) Appl. No.: 12/659,444

(22) Filed: Mar. 9, 2010

(65) Prior Publication Data
US 2010/0231227 A1 Sep. 16, 2010

(30) Foreign Application Priority Data
Mar. 13, 2009 (KR) .................. 10-2009-0021865

(51) Int. Cl.
*G01R 31/02* (2006.01)
*G01R 31/26* (2006.01)

(52) U.S. Cl. .................. 324/537; 324/762.01

(58) Field of Classification Search .......... 324/548, 324/537, 500, 555, 76.11, 762.01, 762.08, 324/762.09, 763.01, 549; 702/1, 42; 73/760, 73/789, 787, 794; 340/665; 365/201
See application file for complete search history.

(56) References Cited

U.S. PATENT DOCUMENTS

| | | | |
|---|---|---|---|
| 5,917,765 A * | 6/1999 | Morishita et al. | 365/201 |
| 6,501,691 B2 * | 12/2002 | Kawamoto et al. | 365/201 |
| 6,839,293 B2 * | 1/2005 | Kawamoto et al. | 365/189.15 |
| 7,227,351 B2 | 6/2007 | Kim et al. | |
| 2008/0062789 A1 | 3/2008 | Han et al. | |
| 2008/0204064 A1 | 8/2008 | Zhang et al. | |
| 2010/0142300 A1 * | 6/2010 | Chen et al. | 365/201 |

FOREIGN PATENT DOCUMENTS

| | | |
|---|---|---|
| KR | 10-2005-0007815 A | 1/2005 |
| KR | 10-2008-0065149 A | 7/2008 |
| KR | 10-0851550 B1 | 8/2008 |

* cited by examiner

Primary Examiner — Hoai-An D Nguyen
(74) Attorney, Agent, or Firm — Lee & Morse, P.C.

(57) ABSTRACT

A reliability evaluation system comprises a reliability evaluation circuit and a reliability evaluation control circuit. The reliability evaluation circuit includes a stress device array and a stress voltage generating block configured to receive a control voltage, generate stress voltages generated by using two reference voltages, and apply the stress voltages to the unit devices in a stress mode via first I/O lines according to the control voltage. The stress device array includes the unit devices that are matrix-arrayed. Each of the unit devices has a first terminal connected to one of the first I/O lines and a second terminal connected to one of second I/O lines. The reliability evaluation control circuit is configured to generate the control voltage and the two reference voltages, and test reliability of the unit devices by using the first I/O lines and the second I/O lines.

10 Claims, 5 Drawing Sheets

RELIABILITY EVALUATION CIRCUIT AND RELIABILITY EVALUATION SYSTEM

BACKGROUND

1. Field

Embodiments relate to a reliability evaluation circuit and a reliability evaluation system that are used to evaluate reliability of a plurality of unit devices corresponding to a stress voltage. More particularly, embodiments relate to a reliability evaluation circuit and a reliability evaluation system that can apply a plurality of stress voltages having different voltage levels to a plurality of unit devices, and rapidly determine reliability of the unit devices corresponding to the applied stress voltages.

2. Description of the Related Art

Reliability of an integrated circuit (IC) is determined by predicting not only when the IC operates under a normal conditions, but also when the IC operates under abnormal conditions. Here, the normal condition means a condition in which a power and a signal having an optimal strength and magnitude are applied to the IC. Abnormal conditions includes conditions in which a voltage level of power applied to the IC is higher or lower than that in the normal condition. Here, the IC is a circuit that is embodied in a semiconductor device so as to perform predetermined functions or a semiconductor device having the circuit.

The IC includes unit devices, such as a transistor, a capacitor, a resistor, and metal-lines having a plurality of different line widths. The IC may further include an inductor. Thus, it is necessary to determine reliability of the IC by considering reliability of each of the transistor, the capacitor, the resistor, the inductor, and the plurality of metal-lines.

In general, reliability of the IC is evaluated in developments of processes applying to the IC. However, in order to assure stability of a corresponding process while products are manufactured, evaluation of reliability is generally performed on the corresponding process in which products are manufactured. Evaluation of the reliability may include resistance evaluation corresponding to a stress voltage for transistors having different ratios of a gate length to a gate width, capacitors having different areas, thicknesses, and materials of insulators, resistors formed of different materials, inductors, and metal-lines having different line widths. In order to rapidly evaluate reliabilities of the unit devices, an accelerated life test (ALT) may be conducted. At this time, reliability of each unit device is evaluated by applying a stress voltage having a voltage level higher than a voltage level used in a normal operation. When the stress voltage is applied to each unit device for a predetermined time period, and the voltage level of the stress voltage is varied, the reliability of each unit device corresponding to the stress voltages having various voltage levels may be evaluated at the same time.

SUMMARY

Embodiments are therefore directed to a reliability evaluation circuit and a reliability evaluation system that overcomes one or more of the problems due to the limitations and disadvantages of the related art.

It is a feature of an embodiment to apply a plurality of stress voltages having different voltage levels to a plurality of unit devices.

It is a feature of an embodiment to rapidly determine reliability of the unit devices corresponding to the applied stress voltages.

At least one of the above and other features and advantages may be realized by providing a reliability evaluation circuit, including a stress device array including plurality of unit devices that are matrix-arrayed, each of the unit devices having a first terminal connected to one of a plurality of first I/O (input/output) lines and a second terminal connected to one of a plurality of second I/O lines, and a stress voltage generating block configured to receive a control voltage, generate a plurality of stress voltages having different voltage levels by using first and second reference voltages, and apply the plurality of stress voltages to the unit devices in a stress mode via the plurality of first I/O lines according to the control voltage.

The stress voltage generating block may include a divided-voltage generator configured to generate the plurality of divided voltages by using the first reference voltage and the second reference voltage, and a buffering block configured to buffer the plurality of divided voltages in response to the control voltage.

When the received control voltage indicates the stress mode, the plurality of stress voltages may have voltage levels at which the plurality of divided-voltages are respectively buffered. When the control voltage indicates the measurement mode, the plurality of stress voltages may be in a high impendence state.

Each of the plurality of unit devices may have at least three terminals. A third terminal of the at least three terminals may be connected to at least one of the plurality of first I/O lines, or connected to at least one of the plurality of second I/O lines.

The plurality of unit devices may include at least one of a capacitor, a resistor, an inductor, a transistor, and metal-lines having different line widths.

At least one of the above and other features and advantages may be realized by providing a reliability evaluation system, including a reliability evaluation circuit including a stress device array including plurality of unit devices that are matrix-arrayed, each of the unit devices having a first terminal connected to one of a plurality of first I/O (input/output) lines and a second terminal connected to one of a plurality of second I/O lines, and a stress voltage generating block configured to receive a control voltage, generate a plurality of stress voltages generated by using two reference voltages, and apply the plurality of stress voltages to the unit devices in a stress mode via a plurality of first I/O lines according to the control voltage, and a reliability evaluation control circuit configured to generate the control voltage and the two reference voltages and test reliability of the plurality of unit devices by using the plurality of first I/O lines and the plurality of second I/O lines.

In the stress mode, the control voltage may activate application of the plurality of stress voltages to the plurality of unit devices. In the measurement mode, the control voltage may deactivate application of the plurality of stress voltages to the plurality of unit devices, and the reliability evaluation control circuit may measure electrical characteristics of the plurality of unit devices via the plurality of first I/O lines and the plurality of second I/O lines.

The plurality of stress voltages may be simultaneously applied to the plurality of unit devices.

The electrical characteristic of the plurality of unit devices that are matrix-arrayed may be sequentially measured by a line-unit.

The plurality of unit devices may include at least one of a capacitor, a resistor, an inductor, a transistor, and metal-lines having different line widths.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
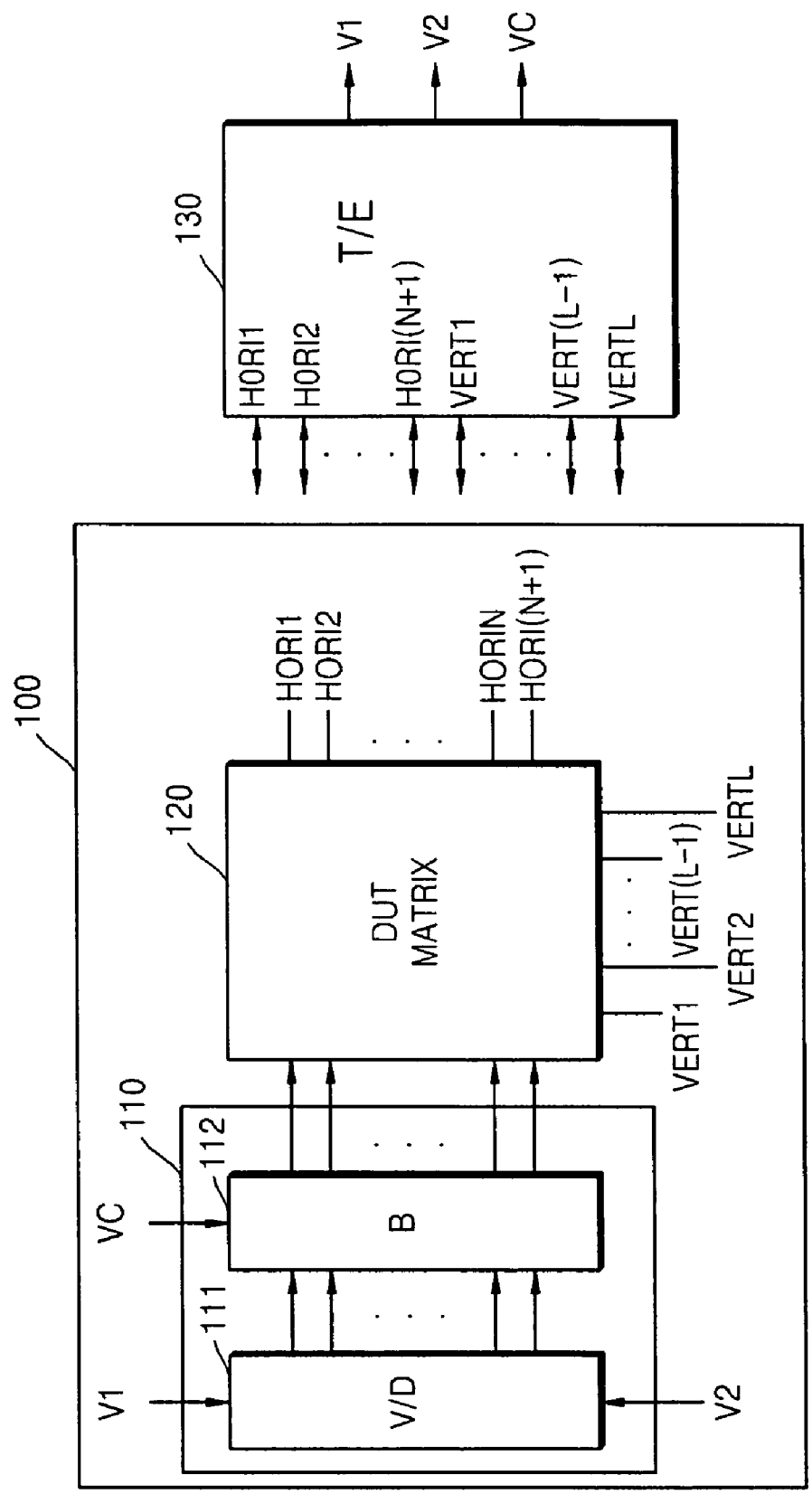
FIG. 1 illustrates a block diagram of a reliability evaluation system according to an embodiment.

Korean Patent Application No. 10-2009-0021865, filed on Mar. 13, 2009, in the Korean Intellectual Property Office, and entitled: "Reliability Evaluation Circuit and Reliability Evaluation System Cross-Reference to Related Applications," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected to" other element, it can be connect directly to the other element, or one or more intervening elements may also be present. Further, it will be understood that when an element is referred to as being "connected between" two elements, it can be the only element between the two elements, or one or more intervening elements may also be present. Like reference numerals refer to like elements throughout.

FIG. 1 illustrates a block diagram of a reliability evaluation system according to an embodiment. Referring to FIG. 1, the reliability evaluation system may include a reliability evaluation circuit 100 and a reliability evaluation control circuit 130. The reliability evaluation circuit 100 may include a stress voltage generating block 110 and a stress device array 120.

The stress voltage generating block 110 may generate a plurality of stress voltages having different voltage levels by using first and second reference voltages V1 and V2. The stress voltage generating block 110 may output the plurality of stress voltages via a plurality of first input/output (I/O) lines HORI1 through HORI(N+1) (N is an integer) according to a control voltage VC. The stress voltage generating block 110 may include a divided-voltage generator 111 and a buffering block 112. The divided-voltage generator 111 may generate a plurality of divided-voltages having different voltage levels between the first reference voltage V1 and the second reference voltage V2. The buffering block 112 may buffer the divided-voltages in response to the control voltage VC.

The stress device array 120 may have a plurality of unit devices that are matrix-arrayed. A terminal of each of the unit devices may be connected to one of the first I/O lines HORI1 through HORI (N+1) (N is an integer larger than 1). Another terminal of each of the unit devices may be connected to one of a plurality of second I/O lines VERT1 through VERTL (L is an integer larger than 1).

The reliability evaluation control circuit 130 may generate the control voltage VC and the first and second reference voltages V1 and V2. The reliability evaluation control circuit 130 may test reliability of the unit devices included in the reliability evaluation circuit 100 by using the first I/O lines HORI1 through HORI(N+1) and the second I/O lines VERT1 through VERTL.

The reliability evaluation circuit 100 as illustrated in FIG. 1 may operate in a stress mode and a measurement mode. In the stress mode, the stress voltages having different voltage levels may be applied to the stress device array 120 included in the reliability evaluation circuit 100. After application of the stress voltages is discontinued, the stress mode may be changed to the measurement mode. In the measurement mode, an effect of the stress voltages to each of the unit devices may be measured. Thus, while the control voltage VC and the first and second reference voltages V1 and V2 may have normal voltage levels in the stress mode, the control voltage VC and the first and second reference voltages V1 and V2 may be deactivated or in a high impendence state in the measurement mode.

Figure 2:
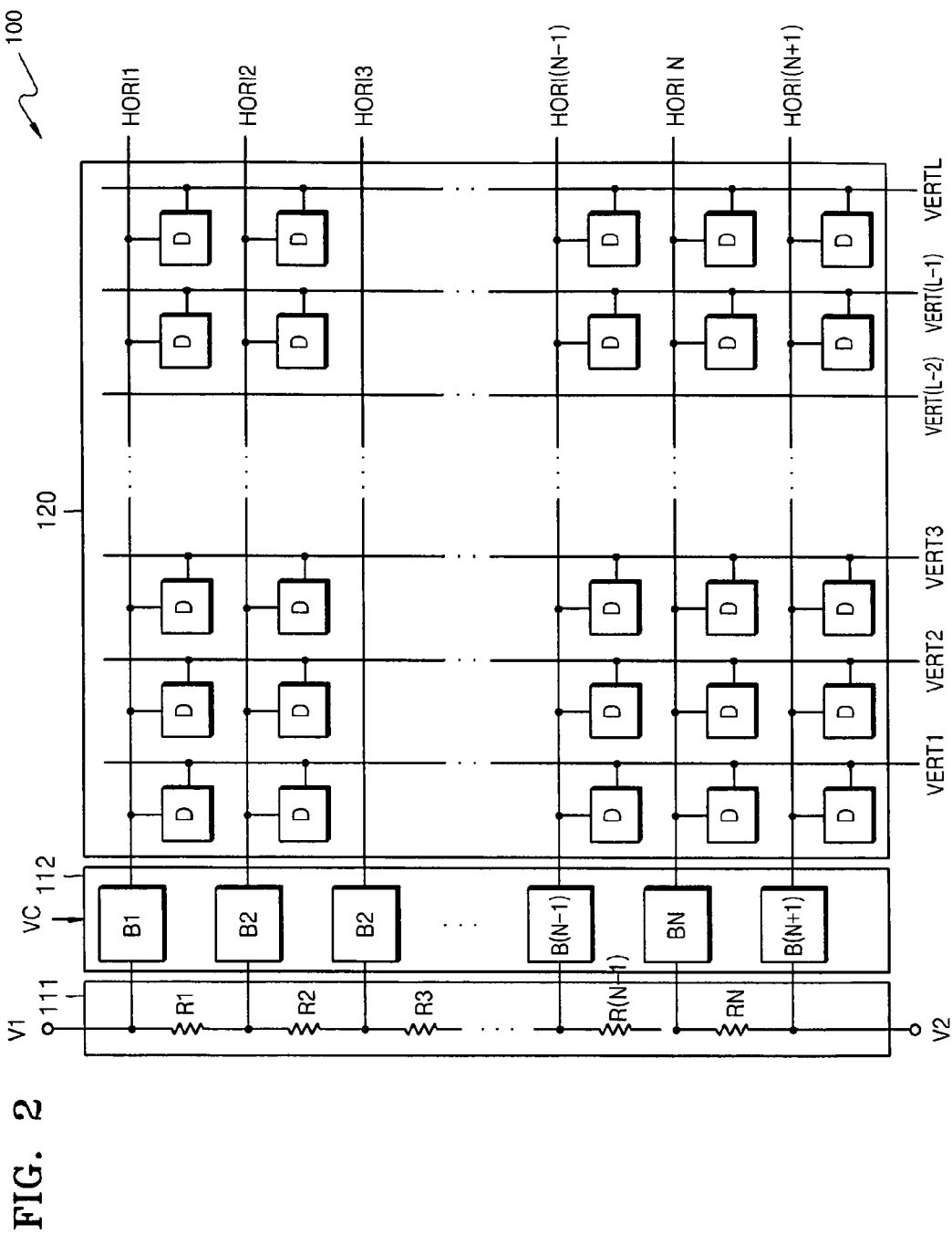
FIG. 2 illustrates a circuit diagram of the reliability evaluation circuit illustrated in FIG. 1.

FIG. 2 illustrates a detailed circuit diagram of the reliability evaluation circuit 100 illustrated in FIG. 1. As illustrated in detail in FIG. 2, the stress device array 120 includes a matrix array of unit devices D. Unit devices D may include, for example, a capacitor, a resistor, an inductor, a transistor, and metal-lines having different line widths Referring to FIG. 2, the divided-voltage generator 111 may be embodied as resistors R1 through RN arrayed between two terminals having reference voltage potentials V1 and V2, respectively. The buffering block 112 may be embodied as a plurality of buffer circuits B1 through B(N+1). However, the divided-voltage generator 111 and the buffering block 112 are not limited to the embodiment illustrated in FIG. 2. The divided-voltage generator 111 and the buffering block 112 may be embodied in a different manner. When the voltage level of the control voltage VC indicates the stress mode, the buffer circuits B1 through B(N+1) in the buffering block 112 may be normally operated. When the voltage level of the control voltage VC indicates the measurement mode, outputs of the buffers in the buffering block 112 may be in a high impendence state. A mode of the buffer circuits may be changed to the stress mode or the measurement mode according to the voltage level of the control voltage VC.

Figure 3:
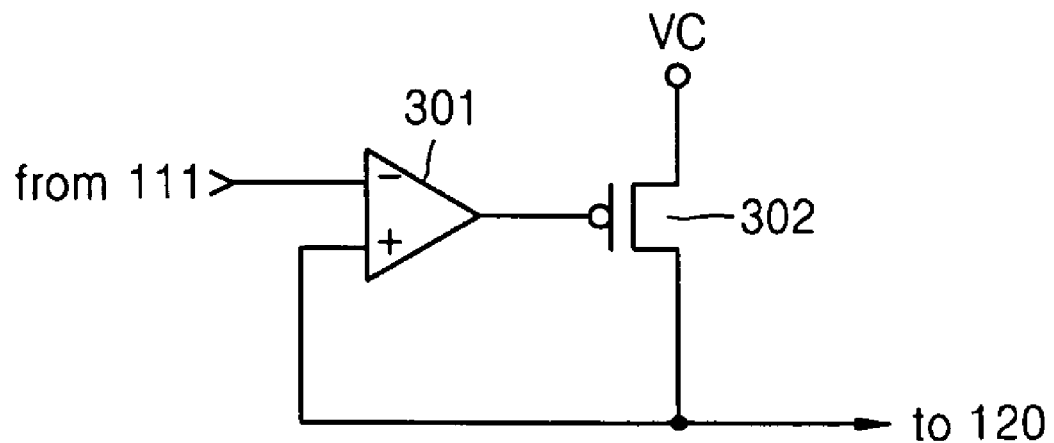
FIG. 3 illustrates a circuit diagram of a buffer circuit in a buffering block of the circuit illustrated in FIG. 2.

FIG. 3 illustrates a schematic circuit diagram of a buffer circuit in the buffering block 112. The buffer circuit may include an operational amplifier 301 and a transistor 302, here a pMOS transistor. The operational amplifier 301 may receive the output from the divided voltage generator 111 at an inverting input and an output of the transistor 302 at the non-inverting input, and an output thereof may be provided to a gate terminal of the transistor 302. The control voltage VC may be connected to another terminal of the transistor 302. The output of the transistor 302 may also be provided to the stress device array 120. The buffer circuit illustrated in FIG. 3 is well known to one of ordinary skill in the art. Therefore, detailed operations of the buffer circuit are not described here.

The stress device array 120 may be embodied as a plurality of unit devices D that are matrix-arrayed between a plurality of first I/O lines HORI1 through HORI(N+1) and a plurality of second I/O lines VERT1 through VERTL. As illustrated in FIG. 2, the stress device array 120 may include a plurality of two-terminal unit devices D. Referring to FIG. 2, a first terminal of each unit device D may be connected to one of the first I/O lines HORI1 through HORI(N+1). A second terminal of each unit device D may be connected to one of the second I/O lines VERT1 through VERTL.

Figure 4:
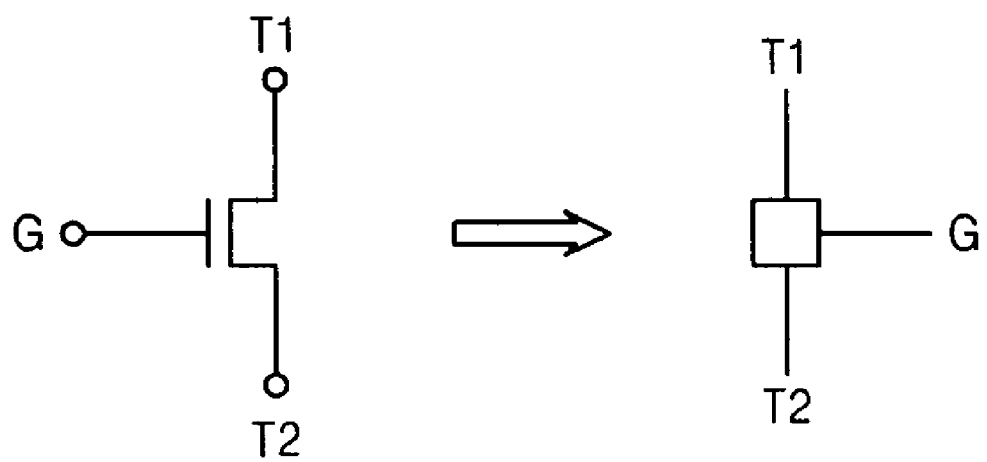
FIG. 4 illustrates a schematic diagram of a three-terminal device, and symbols representing the three terminals.

FIG. 4 illustrates a schematic diagram of a three-terminal device, and symbols representing the three terminals.

Referring to FIG. 4, a transistor is illustrated as an example of the three-terminal device. The transistor may include a first terminal T1 and a second terminal T2 that are a drain and a source or vice versa, respectively, and a third terminal G that is a gate. Here, if a bulk of the transistor is defined as a fourth terminal (not shown), the transistor illustrating in FIG. 4 may be defined as a four-terminal device.

Figure 5:
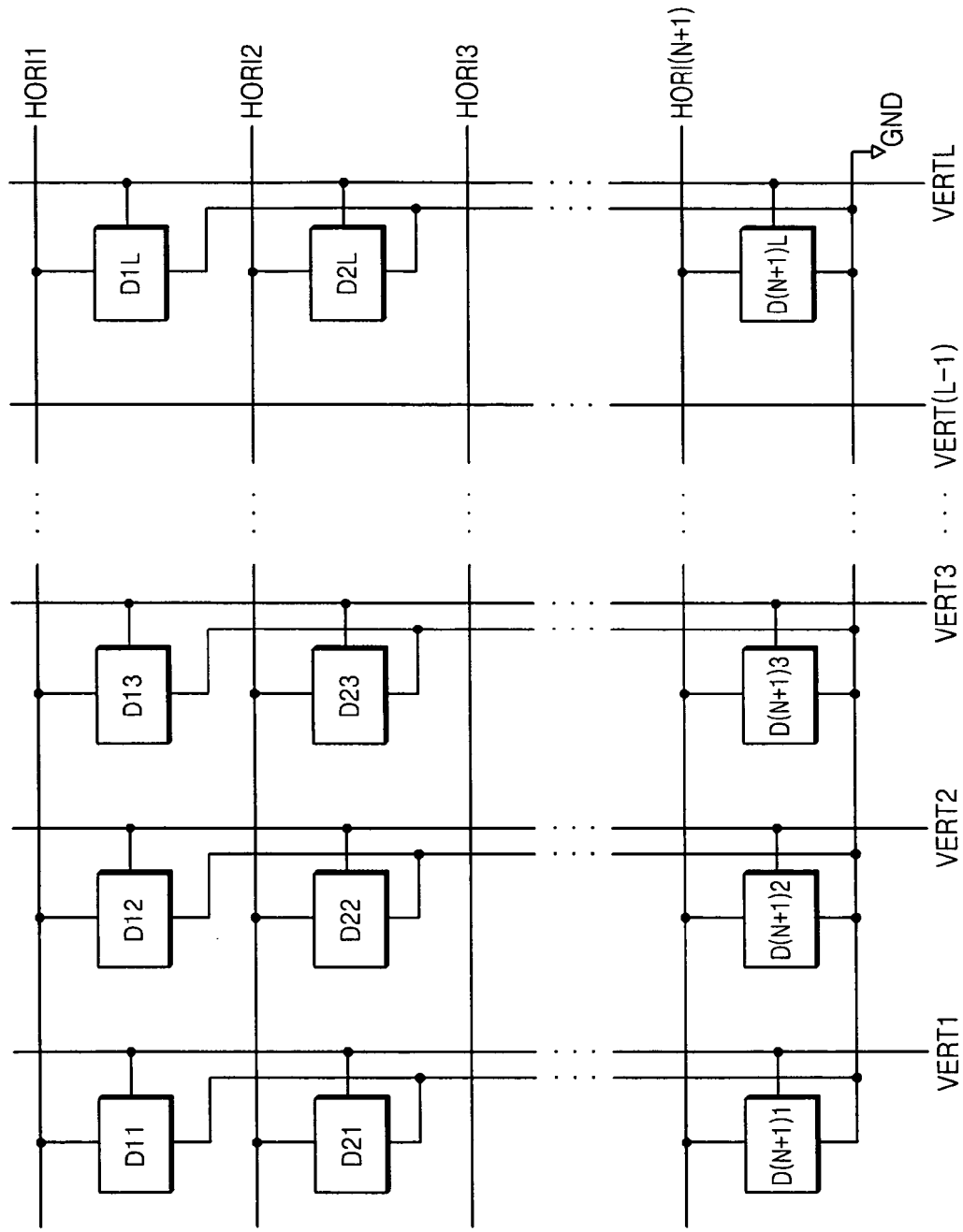
FIG. 5 illustrates a circuit diagram of a stress device array including a plurality of three-terminal devices.

FIG. 5 illustrates a schematic circuit diagram of a stress device array including a plurality of three-terminal devices.

Referring to FIG. 5, each of a plurality of three-terminal devices D11 through D(N+1)L may include a first terminal T1, a second terminal T2, and a third terminal G. The first terminal T1 is connected to one of first I/O lines HORI1 through HORI (N+1). The second terminal T2 is commonly connected to another one of the first I/O lines HORI1 through HORI (N+1). The third terminal G is connected to one of a plurality of second I/O lines VERT1 through VERTL. Here, the another one of the first I/O lines HORI1 through HORI (N+1), to which the second terminal T2 is commonly connected, may be connected to a ground GND. When a stress voltage is applied, an electrical characteristic of the three-terminal device may be measured. Here, although the three-terminal devices are provided for the stress device array, the three-terminal devices may be replaced with four or more-terminal devices. Detailed description thereof is not provided here.

Figure 6:
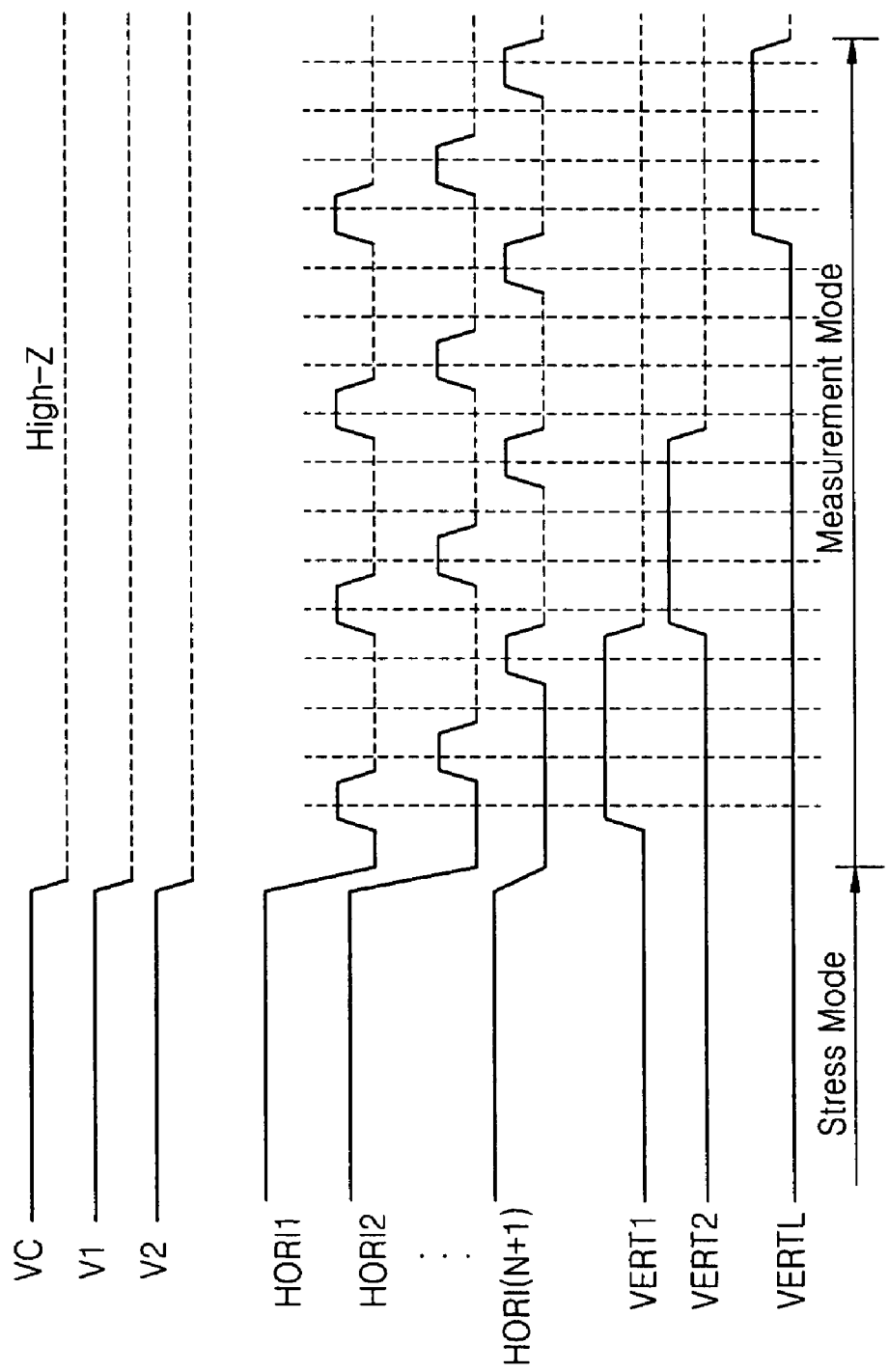
FIG. 6 illustrates a waveform diagram of signals that are used in a reliability evaluation system according to another embodiment.

FIG. 6 illustrates a waveform diagram of signals that are used in a reliability evaluation system according to another embodiment.

Referring to FIG. 6, each of the signals is divided into signals in a stress mode and signals in a measurement mode. The signals in a stress mode are illustrated in a left side of the waveform diagram. The signals in a measurement mode are illustrated in a right side of the waveform diagram.

Hereinafter, operation of the reliability evaluation system will be described by using the reliability evaluation circuit 100 illustrated in FIG. 2 and the waveform diagram of the signals illustrated in FIG. 6.

The reliability evaluation control circuit 130 may apply a stress voltage to each unit device, and measure an electrical characteristic of each unit device.

In the stress mode, the control voltage VC may activate the application of the stress voltages generated by using two reference voltages V1 and V2. Each of the plurality of second I/O lines VERT1 through VERTL may be connected to a power source having a constant voltage level in such a manner that a stress voltage may be applied to a corresponding unit device. At this time, the second I/O lines VERT1 through VERTL may be grounded.

In a measurement mode, electrical characteristics of a plurality of matrix-arrayed unit devices may be measured by a line-unit.

The reliability evaluation control circuit 130 may activate only the second I/O line VERT1 among the second I/O lines VERT1 through VERTL, and may deactivate the other second I/O lines VERT2 through VERTL. While the first second I/O line VERT1 is activated, a plurality of first I/O lines HORI1 through HORI (N+1) may be sequentially activated and deactivated. At this time, the reliability evaluation control circuit 130 may measure an electrical characteristic of a unit device arranged between a first I/O line and a second I/O line that are simultaneously activated. Here, when a line is activated, a constant voltage or a signal is applied to the activated I/O line. When a line is deactivated, no voltage or signal is applied to the deactivated I/O line.

Next, while the second I/O line VERT2 is activated, the reliability evaluation control circuit 130 may sequentially activate and deactivate the first I/O lines HORI1 through HORI (N+1), and measure an electrical characteristic of a corresponding unit device arranged between a first I/O line and a second I/O line that are simultaneously activated. After the last second I/O line VERTL undergoes the aforementioned process, evaluation of the electrical characteristic of the unit devices may be ended.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A reliability evaluation circuit, comprising:
a stress device array including a plurality of unit devices that are matrix-arrayed, each of the unit devices having a first terminal connected to one of a plurality of first I/O (input/output) lines and a second terminal connected to one of a plurality of second I/O lines; and
a stress voltage generating block configured to receive a control voltage, generate a plurality of stress voltages having different voltage levels by using first and second reference voltages, and apply the plurality of stress voltages to the unit devices in a stress mode via the plurality of first I/O lines according to the control voltage.

2. The reliability evaluation circuit as claimed in claim 1, wherein the stress voltage generating block includes:
a divided-voltage generator that generates a plurality of divided-voltages having different voltage levels by using the first reference voltage and the second reference voltage; and
a buffering block that buffers the plurality of divided-voltages in response to the control voltage.

3. The reliability evaluation circuit as claimed in claim 2, wherein
when the control voltage indicates the stress mode, the plurality of stress voltages have voltage levels at which the plurality of divided-voltages are respectively buffered, and
when the control voltage indicates the measurement mode, the plurality of stress voltages are in a high impendence state.

4. The reliability evaluation circuit as claimed in claim 1, wherein each of the plurality of unit devices has at least three terminals, a third terminal of the at least three terminals being connected to at least one of the plurality of first I/O lines or connected to at least one of the plurality of second I/O lines.

5. The reliability evaluation circuit as claimed in claim 1, wherein the plurality of unit devices includes at least one of a capacitor, a resistor, an inductor, a transistor, and metal-lines having different line widths.

6. A reliability evaluation system, comprising:
a reliability evaluation circuit including,
a stress device array including a plurality of unit devices that are matrix-arrayed, each of the unit devices having a first terminal connected to one of a plurality of first I/O (input/output) lines and a second terminal connected to one of a plurality of second I/O lines, and a stress voltage generating block configured to receive a control voltage, generate a plurality of stress voltages generated by using two reference voltages, and apply the plurality of stress voltages to the unit devices in a stress mode via a plurality of first I/O lines according to the control voltage; and a reliability evaluation control circuit configured to generate the control voltage and the two reference voltages, and test reliability of the plurality of unit devices by using the plurality of first I/O lines and the plurality of second I/O lines.

7. The reliability evaluation system as claimed in claim 6, wherein, in the stress mode, the control voltage activates application of the plurality of stress voltages to the plurality of unit devices, and in the measurement mode, the control voltage deactivates application of the plurality of stress voltages to the plurality of unit devices, and the reliability evaluation control circuit measures electrical characteristics of the plurality of unit devices via the plurality of first I/O lines and the plurality of second I/O lines.

8. The reliability evaluation system as claimed in claim 7, wherein the plurality of stress voltages are simultaneously applied to the plurality of unit devices.

9. The reliability evaluation system as claimed in claim 7, wherein the electrical characteristic of the plurality of unit devices that are matrix-arrayed is sequentially measured by a line-unit.

10. The reliability evaluation system as claimed in claim 6, wherein the plurality of unit devices includes at least one of a capacitor, a resistor, an inductor, a transistor, and metal-lines having different line widths.

* * * * *